United States Patent
Cho et al.

(10) Patent No.: US 7,889,563 B2
(45) Date of Patent: Feb. 15, 2011

(54) MEMORY DEVICE AND METHOD OF CONTROLLING READ LEVEL

(75) Inventors: Kyoung Lae Cho, Yongin-si (KR); Donghun Yu, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 71 days.

(21) Appl. No.: 12/453,974

(22) Filed: May 28, 2009

(65) Prior Publication Data

US 2009/0310404 A1    Dec. 17, 2009

(30) Foreign Application Priority Data

Jun. 12, 2008   (KR) .................... 10-2008-0055347

(51) Int. Cl.
    *G11C 16/06* (2006.01)
(52) U.S. Cl. .............. 365/185.2; 365/185.03; 365/236; 365/189.07
(58) Field of Classification Search ............. 365/185.2, 365/185.03, 236, 189.07
    See application file for complete search history.

(56) References Cited

U.S. PATENT DOCUMENTS

| | | | |
|---|---|---|---|
| 6,961,266 B2 * | 11/2005 | Chang ............... | 365/185.03 |
| 6,992,932 B2 | 1/2006 | Cohen | |
| 7,167,395 B1 | 1/2007 | Kobernik et al. | |
| 2005/0013165 A1 | 1/2005 | Ban | |
| 2006/0075320 A1 | 4/2006 | Gendrier et al. | |
| 2007/0091677 A1 | 4/2007 | Lasser et al. | |
| 2007/0201274 A1 | 8/2007 | Yu et al. | |
| 2007/0297226 A1 | 12/2007 | Mokhlesi | |
| 2007/0297245 A1 * | 12/2007 | Mokhlesi ............ | 365/185.28 |
| 2008/0002452 A1 | 1/2008 | Augustin et al. | |

FOREIGN PATENT DOCUMENTS

| KR | 10-2004-0074979 | 8/2004 |
|---|---|---|
| KR | 10-2008-0012199 | 2/2008 |

* cited by examiner

*Primary Examiner*—Huan Hoang
(74) *Attorney, Agent, or Firm*—Harness, Dickey & Pierce, P.L.C.

(57) ABSTRACT

Provided are memory devices and read level controlling methods. A memory device may include: a memory cell array that includes a plurality of memory cells; a counter that counts a number of memory cells with a threshold voltage included in a reference threshold voltage interval among the plurality of memory cells; a first decision unit that compares the counted number of memory cells with a threshold value to thereby decide whether to set a read level based on the reference threshold voltage interval; and a second decision unit that generates a new reference threshold voltage interval based on the comparison result between the counted number of memory cells and the threshold value.

22 Claims, 8 Drawing Sheets

MEMORY DEVICE AND METHOD OF CONTROLLING READ LEVEL

FOREIGN PRIORITY STATEMENT

This application claims priority under 35 U.S.C. §119 to Korean Patent Application No. 10-2008-0055347, filed on Jun. 12, 2008, in the Korean Intellectual Property Office (KIPO), the entire contents of which are incorporated herein by reference.

BACKGROUND

1. Field

Example embodiments relate to apparatuses and/or methods of controlling a read level that is used to read data stored in memory devices. Also, example embodiments relate to apparatuses and/or methods of controlling a read level that is used in a multi-level cell (MLC) or a multi-bit cell (MBC) memory device.

2. Description of Related Art

A single-level cell (SLC) memory device may store one bit of data in a single memory cell. The SLC memory may be referred to as a single-bit cell (SBC) memory. A process of storing one bit of data in a single level cell of the SLC memory device may be referred to as a programming process and may change a threshold voltage of the single level cell. For example, when data of logic value "1" is stored in a single level cell, the single level cell may have a threshold voltage of 1.0 V. When data of logic value "0" is stored in the single level cell, the single level cell may have a threshold voltage of 3.0 V.

Due to a minute electrical characteristic difference between single level cells, the threshold voltages formed in each of the single level cells with the same data programmed may have a distribution within a predetermined or reference range. For example, when a voltage read from a memory cell is greater than 0.5 V and less than 1.5 V, it may be determined that data stored in the memory cell has a logic value of "1". When the voltage read from the memory cell is greater than 2.5 V and less than 3.5 V, it may be determined that the data stored in the memory cell has a logic value of "0". The data stored in the memory cell may be classified depending on the difference between memory cell currents/voltages during the reading operations.

Meanwhile, a multi-bit cell (MLC) memory device that can store data of two or more bits in a single memory cell has been proposed in response to a need for higher integration of memory. The MLC memory device may also be referred to as a multi-bit cell (MBC) memory. However, as the number of bits stored in the single memory cell increases, reliability may deteriorate and the read-failure rate may increase. To program 'm' bits in a single memory cell, any one of $2^m$ threshold voltages may be required to be formed in the memory cell. Due to the minute electrical characteristic difference between memory cells, threshold voltages of memory cells with the same data programmed may form a distribution within a predetermined or reference range. A single threshold voltage distribution may correspond to each of $2^m$ data values that can be generated according to 'm' bits. However, since the voltage window of a memory may be limited, the distance between $2^m$ distributions of threshold voltage between adjacent bits may decrease as 'm' increases, which may cause overlapping of the distributions. If the distributions are overlapped with each other, the read failure rate may increase.

SUMMARY

Example embodiments may provide apparatuses and/or methods that may provide a read level optimized for characteristics of a memory cell changing over time.

Example embodiments may provide apparatuses and/or methods that may reduce time required for searching for an optimal read level of a memory cell.

Example embodiments may provide apparatuses and/or methods that may decide a read level of a memory cell using a consistent searching scheme according to an automatic control scheme.

Example embodiments may provide apparatuses and/or methods that may decide a read level of a memory cell using a reliable searching scheme according to an automatic control scheme.

According to example embodiments, an apparatus may include a memory device. The memory device may include: a memory cell array that includes a plurality of memory cells; a counter that counts a number of memory cells with a threshold voltage included in a reference threshold voltage interval among the plurality of memory cells; a first decision unit that compares the counted number of memory cells with a threshold value to thereby decide whether to set a read level based on the reference threshold voltage interval; and a second decision unit that generates a new reference threshold voltage interval based on the comparison result between the counted number of memory cells and the threshold value.

According to example embodiments, a method of controlling a read level may include: counting a number of memory cells with a threshold voltage included in a reference threshold voltage interval among a plurality of memory cells; comparing the counted number of memory cells with a threshold value; deciding whether to set a read level based on the reference threshold voltage interval, according to the comparison result; and deciding whether to set a new reference threshold voltage interval based on the comparison result.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
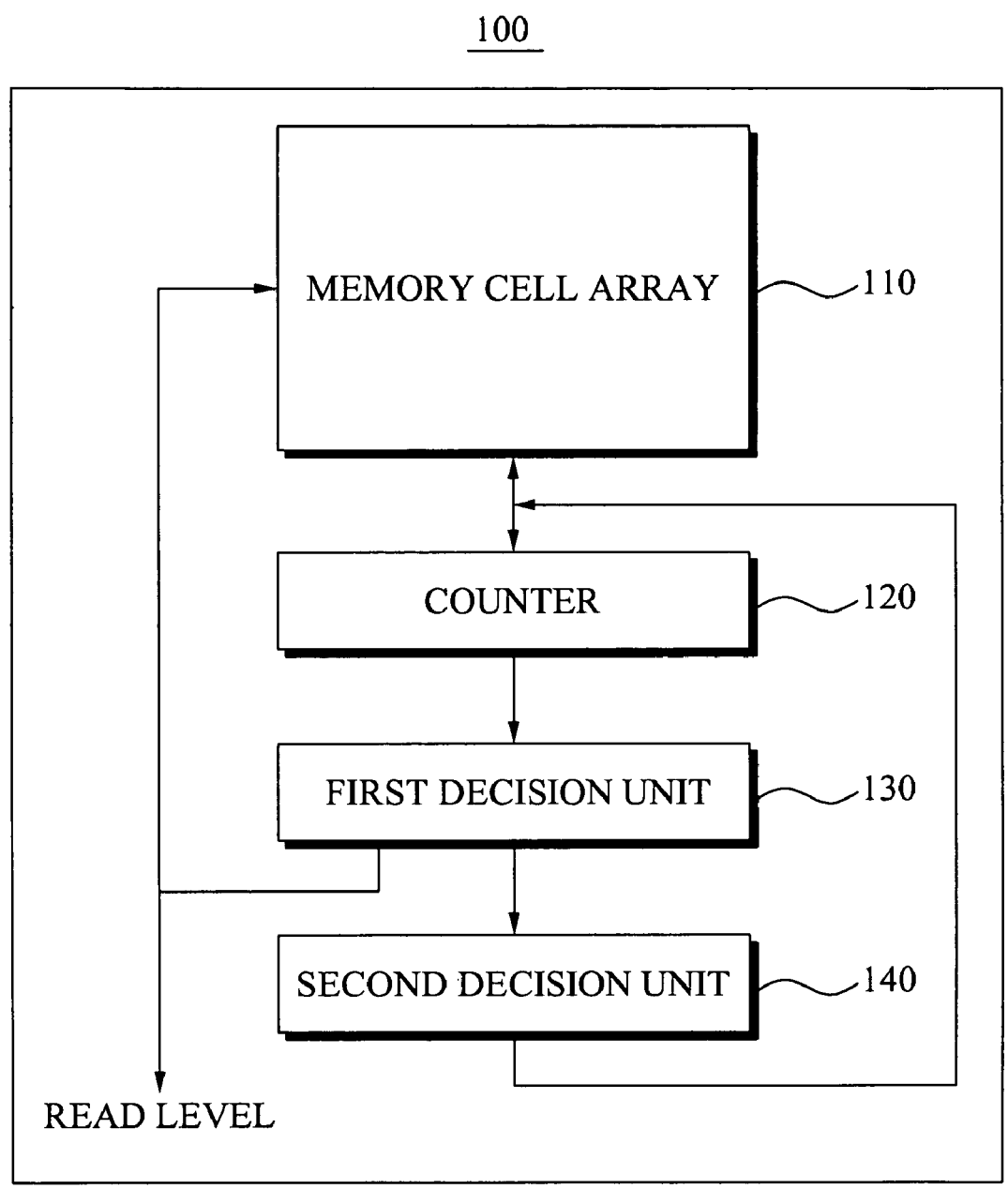
FIG. 1 is a block diagram illustrating an example of a memory device according to example embodiments.

Detailed example embodiments are disclosed herein. However, specific structural and functional details disclosed herein are merely representative for purposes of describing example embodiments. Example embodiments may, however, may be embodied in many alternate forms and should not be construed as being limited to only the embodiments set forth herein.

Accordingly, while example embodiments are capable of various modifications and alternate forms, embodiments thereof are shown by way of example in the drawings and will be described in detail. It should be understood, however, that there is not intent to limit example embodiments to the particular forms disclosed, but to the contrary, example embodiments are to cover all modifications, equivalents, and alternatives falling within the scope of the example embodiments. Like numbers refer to like elements throughout the description of the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved Reference will now be made to example embodiments, which are illustrated in the accompanying drawings, wherein like reference numerals may refer to like components throughout.

FIG. 1 illustrates an example of a memory device 100 according to example embodiments.

Referring to FIG. 1, the memory device includes a memory cell array 110, a counter 120, a first decision unit 130, and a second decision unit 140.

The memory cell array 110 may include a plurality of memory cells. The memory device 100 may change a threshold voltage of each of the memory cells to thereby store data in each of the memory cells.

A process of storing data by changing the threshold voltage of the memory cell may be referred to as "programming". The memory device 100 may set a target threshold voltage interval of the memory cell based on the data to be stored in the memory cell. The memory device 100 may change the threshold voltage of the memory cell to be included in the set target threshold voltage interval.

For example, the memory device 100 may set a target threshold voltage interval of between 1 V and 2 V with respect to a memory cell to store data "1" and may set a target threshold voltage interval of between 3 V and 4 V with respect to a memory cell to store data "0".

The memory device 100 may change a threshold voltage of the memory cell to store data "1" to be included in the target threshold voltage interval of 1 V and 2 V. The memory device 100 may change a threshold voltage of the memory cell to store data "0" to be included in the target threshold voltage interval of between 3 V and 4 V.

According to example embodiments, the memory device 100 may change a threshold voltage of a memory cell based on a comparison with a verify voltage. The memory device 100 may set a verify voltage of the memory cell based on data to be stored in the memory cell.

For example, with respect to the memory cell to store data "1", the memory device 100 may set the verify voltage of 1 V. With respect to the memory cell to store data "0", the memory device 100 may set the verify voltage of 3 V The memory device 100 may change a threshold voltage of the memory cell to store data "1", so that the threshold voltage of the memory cell to store data "1" may have a voltage greater than the verify voltage of 1 V. The memory device 100 may change a threshold voltage of the memory cell to store data "0" so that the threshold voltage of the memory cell to store data "0" may have a voltage greater than the verify voltage of 3 V.

When the memory cell is a multi-bit cell that stores multi-bit data, the memory device 100 may store m-bit data using $2^m$ verify voltage levels or target threshold voltage intervals. The memory device 100 may set $2^m$ verify voltage levels and select any one verify voltage level from $2^m$ verify voltage levels based on data to be stored in the memory cell. The memory device 100 may change the threshold voltage of the memory cell using the selected verify voltage level.

The memory device 100 may compare the threshold voltage of the memory cell with a reference voltage to thereby decide the range of the threshold voltage and read data stored in the memory cell based on the decided range. For example, the memory device 100 may set the reference voltage of 2.5 V. The memory device 100 may decide, as "1", data stored in a memory cell with a threshold voltage less than the reference voltage of 2.5 V and may decide, as "0", data stored in a memory cell with a threshold voltage greater than the reference voltage of 2.5 V.

When the memory cell is a multi-bit cell that stores multi-bit data, the memory device 100 may decide m-bit data using $2^m$ or $(2^m-1)$ verify voltage levels.

The memory cell storing data according to change in the threshold voltage may include a control gate and a floating gate. An insulating layer may be disposed between the control gate and the floating gate. Another insulating layer may be inserted between the floating gate and a substrate.

A programming process of storing data in the memory cell, or an erase process of erasing data stored in the memory cell may be performed according to mechanism such as Fowler-Nordheim (F-N) tunneling, hot carrier effect, and the like.

Under a particular bias condition, a channel may be formed in a region most adjacent to the floating gate on a substrate region. The channel may be a region generated by clustering together minority carriers of the substrate region. The memory device 100 may control the minority carriers to thereby program data in the memory cell, or to erase the data stored in the memory cell.

When a particular bias is applied to a source, a drain, and a control gate of the substrate region, the minority carriers of the channel may move to the floating gate. Mechanisms of moving the minority subcarriers to the floating gate may representatively include hot carrier effect and F-N tunneling.

Memory cells storing the same data may be programmed based on the same target threshold voltage interval or the same verify voltage. According to example embodiments, electrical characteristics of each memory cell may be minutely different and thus a threshold voltage of the memory cells storing the same data may form a distribution with a predetermined or reference range.

A programming process of the memory cell may give some undesired affect to a threshold voltage of surrounding memory cells, which may occur due to, for example, FG coupling, program disturbance, and the like.

FG coupling may denote a phenomenon where a threshold voltage of a central memory cell is affected by a change amount of threshold voltage of surrounding memory cells. Due to coupling of a parasitic capacitance between floating gates of memory cells, the threshold voltage of the central memory cell may be affected.

If the programming process increases the threshold voltage, FG coupling may cause the threshold voltage of the central memory to be increased to be greater than a desired value. Due to mechanism such as FG coupling, a distribution of threshold voltage of memory cells may be spread.

Since a voltage window where a multi-bit cell operates is limited, a distribution of the threshold voltage may overlap another distribution of an adjacent threshold voltage as the distribution of the threshold voltage spreads. As an overlapping level of the threshold voltage increases, an error rate of inaccurately reading programmed data may also increase. When the memory cell is a multi-bit cell that stores m-bit data, the threshold voltage of memory cells of the memory cell array 110 may form $2^m$ distributions. As m increases, the error rate may increase due to undesired spread of the distribution.

The program disturbance may denote a phenomenon in which threshold voltages of surrounding memory cells are affected by a program condition voltage programmed in the memory cell. Due to the program disturbance, the threshold voltages of the surrounding memory cells may undergo undesired affects due to the programming.

Charge loss over time and the like may cause the undesired change in a threshold voltage of memory cells.

In comparison to F-N tunneling, hot carrier effect may move carriers relatively fast, but may inflict a relatively large amount of physical damage to the insulating layer disposed between the floating gate and the substrate. F-N tunneling may inflict a relatively small amount of damage to the insulating layer. However, when a number of times that data is programmed in the memory cell and the data is erased in the memory cell increases, damage thereof may not be insignificant.

When charges are formed by accumulating carriers in the floating gate, data of the memory cell may be determined based on the formed charges. According to example embodiments, if the insulating layer surrounding the floating gate is physically damaged, a charge leaking path may be formed in the insulating layer.

Charges charged to the floating gate should be maintained in the floating gate until a discharging condition is prepared. However, the charges charged in the floating gate may spread due to a natural spreading phenomenon. If the insulating layer surrounding the floating gate is damaged and thereby the charge leaking path is formed, the charges charged in the floating gate may be lost. The charge loss mechanism causing the charges charged to the floating gate to become lost may decrease the threshold voltage of the memory cell.

A process of programming data in the memory cell may require a relatively longer period of time than a process of reading data from the memory cell. Since it may take a relatively long to program the data in the memory cell, the memory device 100 may simultaneously program data in a plurality of memory cells and thereby reduce a total data programming time. Herein, a set of the simultaneously programmed memory cells may be referred to as a page. A single page may include any number of memory cells, and memory cell array 110 may include any number of pages. For example, a single page may include a thousand memory cells. The memory cell array 110 may include thousands of pages.

According to example embodiments, the memory device 100 may simultaneously program data in memory cells connected to a single word line. The word line may be connected to a gate terminal of each of memory cells included in the single page.

The memory device 100 may simultaneously compare a reference voltage with a threshold voltage of each of memory cells included in the single page. The memory device 100 may simultaneously read data stored in each of the memory cells that are included in the single page.

The memory device 100 may select a page corresponding to a memory address that corresponds to data to be read, and select a word line that is connected with memory cells included in the selected page. The memory device 100 may apply a program voltage to the selected word line and thereby enable the memory cells included in the selected page to reach a read preparation state.

A reference voltage used to read data stored in the memory cell is referred to as a read level and may be determined based on a characteristic of the memory cell.

When time elapses after data is programmed in the memory cell, a threshold voltage of the memory cell may be varied due to mechanisms such as charge loss, a program disturbance, and/or FG coupling. According to example embodiments, the memory device 100 may detect a change in the threshold voltage of memory cell and decide an optimal read level for the changed threshold voltage. In order to search for the optimal read level, the memory device 100 may set a reference threshold voltage interval that includes a threshold voltage between an upper bound and a lower bound.

The memory device 100 may set a reference threshold voltage interval with a much smaller range than a general threshold voltage interval. For example, when the general threshold voltage interval includes the range of [2.0 V, 3.0 V], the memory device 100 may set the reference threshold voltage interval of [2.0 V, 2.01 V].

The counter 120 may count a number of memory cells with a threshold voltage included in the reference threshold voltage interval among the plurality of memory cells.

The first decision unit 130 may compare the counted number of memory cells with a threshold value to thereby decide whether to set a read level based on the reference threshold voltage interval.

The second decision unit 140 may generate a new reference threshold voltage interval based on the comparison result between the counted number of memory cells and the threshold value.

When the counted number of memory cells is less than the threshold value, the first decision unit 130 may set the read level based on the current reference threshold voltage interval. According to example embodiments, the first decision unit 130 may control the second decision unit 140 to not generate a new reference threshold voltage interval. The first decision unit 130 may generate a digital code corresponding to the read level. The memory device 100 may further include a digital-to-analog (D/A) converter to generate an analog voltage level corresponding to the generated digital code.

The memory cell array 110, the counter 120, the first decision unit 130, and the second decision unit 140 may form a feedback loop. The memory device 100 may apply an automatic control scheme to the feedback loop.

It can be easily predicted that a number of memory cells with a threshold voltage between a distribution and another distribution is less than a number of memory cells with a threshold voltage corresponding to a peak of distributions. In order to search for an acceptable read level corresponding to a boundary between distributions, the memory device 100 may search for a reference threshold voltage interval corresponding to a number of memory cells that is less than a predetermined or reference threshold. The acceptable read level may be a read level that does not cause an error. Also, the acceptable read level may be a read level that causes an error to be at a level controllable by error control codes (ECC).

A process of combining effective information and a redundant bit to thereby generate a codeword may be referred to as an ECC encoding process. A process of interpreting the codeword to thereby separate the effective information from the codeword may be referred to as an ECC decoding process.

The simplest example of the ECC encoding process may include an example of adding a parity as a redundant bit. When the effective information is transferred via a channel, the ECC encoding and/or ECC decoding process may detect or correct an error that may occur according to a channel signature.

According to an example of an ECC decoder, when a number of errors of an input codeword is less than or equal to an error correcting capability, all the errors of the input codeword may be correctable. A code of explicitly showing the error correcting capability may include block codes, and the like. Examples of block codes may include Bose, Ray-Chaudhuri, Hocquenghem (BCH) codes, Reed-Solomon (RS) codes, and the like. Decoding schemes thereof may include a Meggitt decoding scheme, a Berlekamp-Massey decoding scheme, a Euclid decoding scheme, and the like.

The memory device 100 may set a predetermined or reference threshold value to enable searching of the acceptable read level. The predetermined or reference threshold value may be a number of desired bits of a memory cell corresponding to the reference threshold voltage interval.

The memory device 100 may set the reference threshold voltage interval within a given threshold voltage range and search for a reference threshold voltage interval where a number of memory cells corresponding to the reference threshold voltage interval reaches a local minimum.

The memory device 100 may search for the local minimum using a proportional integral derivative (PID) control scheme. The memory device 100 may set a parameter of a PID controller so that a response of the PID controller may express a distribution. According to example embodiments, the PID controller may input the comparison result between the counted number of memory cells and the threshold value.

The second decision unit 140 may add an offset to an upper bound of the reference threshold voltage interval to thereby generate an upper bound of the new threshold voltage interval, and may also add the offset to a lower bound of the reference threshold voltage interval to thereby generate a lower bound of the new threshold voltage interval.

The second decision unit 140 may decide the size of the offset based on a difference between the counted number of memory cells and the threshold value.

The second decision unit 140 may decide a sign of the offset based on a variation of the counted number of memory cells. The second decision unit 140 may select the sign of the offset as any one of + and −, and may initialize the offset using the selected sign. When a number of memory cells that is counted based on a current reference threshold voltage interval is less than a number of memory cells that is counted based on a previous reference threshold voltage interval, the second decision unit 140 may maintain the sign of the offset. Conversely, when the number of memory cells that is counted based on the current reference threshold voltage interval is greater than the number of memory cells that is counted based on the previous reference threshold voltage interval, the second decision unit 140 may change the sign of the offset.

The second decision unit 140 may decide the size of the offset based on a number of times that the new threshold voltage interval is generated. For example, when the number of times that the reference threshold voltage is generated is less than five times, the second decision unit 140 may set the size of the offset to 0.10 V. Conversely, when the number of times that the reference threshold voltage interval is generated is greater than or equal to five times, the second decision unit 140 may set the size of the offset to 0.05 V When a number of times that the new reference threshold voltage interval is generated is greater than or equal to a maximum allowance value, the first decision unit 130 may control the second decision unit 140 to not generate the reference threshold voltage interval, any more. According to example embodiments, the first decision unit 130 may select, from current and previous threshold voltage intervals, a reference threshold voltage interval where the counted number of memory cells reaches local minimum. The first decision unit 130 may set a read level based on the selected reference threshold voltage interval.

The first decision unit 130 may set the read level and then transmit the set read level to the memory cell array 110. According to example embodiments, information associated with the read level may be transferred to an external controller of the memory device.

Figure 2:
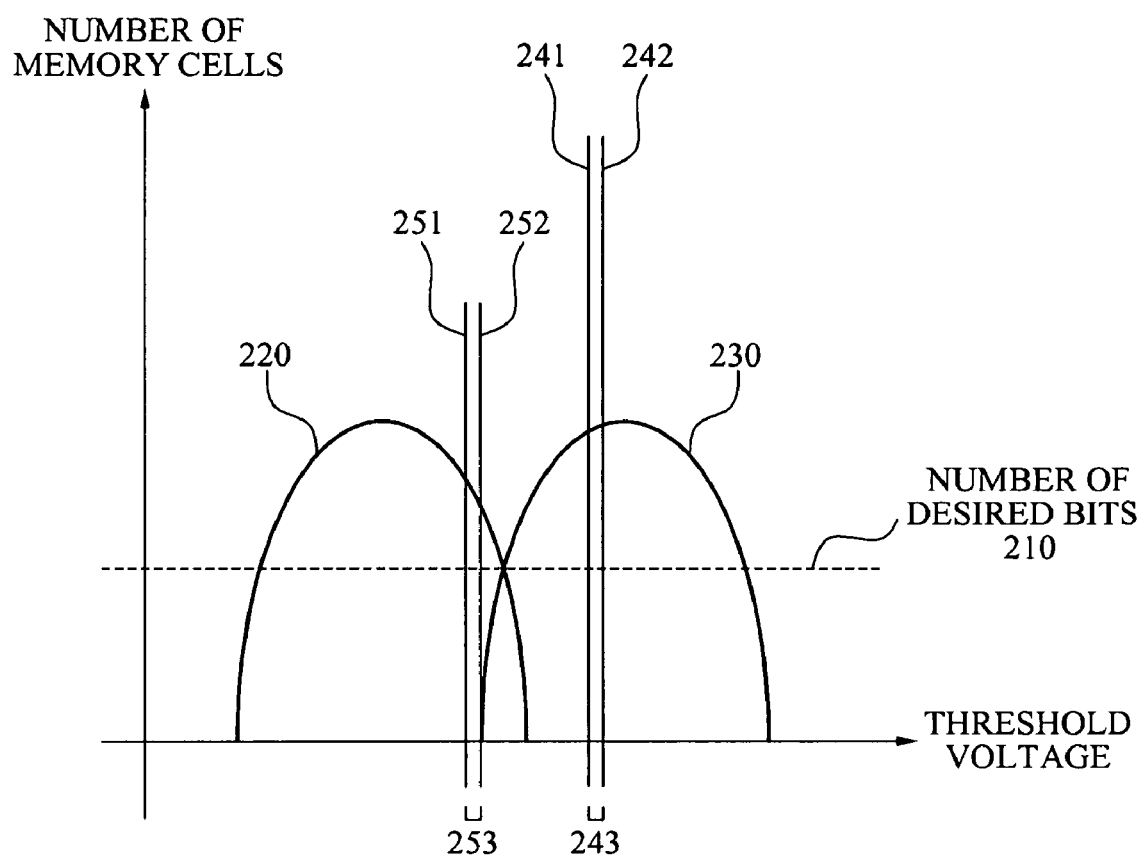
FIG. 2 illustrates an example of an operation of the memory device shown in FIG 1.

FIG. 2 illustrates an example of an operation of the memory device 100 shown in FIG. 1.

FIG. 2 illustrates a number of memory cells corresponding to each of a plurality of threshold voltages.

A threshold voltage of memory cell storing data A may form a distribution 220. A threshold voltage of memory cell storing data B may form a distribution 230.

According to example embodiments, the data A and B may be, for example, "1" and "0", respectively. When the memory cell stores two-bit data, the data A and B may be, for example, "10" and "01", respectively. When the memory cell stores three-bit data, the data A and B may be, for example "101" and "100", respectively.

The memory device 100 may select an interval 243 as a first reference threshold voltage interval. An upper bound of the interval 243 is a voltage level 242 and a lower bound of the interval 243 is a voltage level 241.

The memory device 100 may count a number of memory cells with a threshold voltage included in the interval 243. The memory device 100 may count a number of memory cells with a threshold voltage greater than the voltage level 241. According to example embodiments, the number of memory cells with the threshold voltage greater than the voltage level 241 may be denoted as X. The memory device 100 may count a number of memory cells with a threshold voltage greater than the voltage level 242. According to example embodiments, the number of memory cells with the threshold voltage grater than the voltage level 242 may be denoted as Y. The memory device 100 may calculate a difference between X and Y, and may regard the calculated difference as the number of memory cells with the threshold voltage included in the interval 243.

When the number of memory cells having a threshold voltage included in the interval 243 is greater than a predetermined or reference threshold value, the memory device 100 may set a second reference threshold voltage interval. The predetermined or reference threshold value may be determined based on a number of desired bits 210.

The memory device 100 may set an offset and decide, as a lower bound of the second reference threshold voltage interval, a voltage level 251 where the offset is added to the voltage level 241. The memory device 100 may select an interval 253 as the second reference threshold voltage interval. An upper bound of the interval 253 is a voltage level 252.

The memory device 100 may count a number of memory cells with a threshold voltage included in the interval 253. When the number of memory cells having a threshold voltage included in the interval 253 is greater than a predetermined or reference threshold value, the memory device 100 may set a third reference threshold voltage interval.

An optimal read level that the memory device 100 desires to search for may be a threshold voltage included in an overlapping region of the distributions 220 and 230. When the memory device 100 sets an initial offset to be large, the optimal read level may be discarded as shown in FIG. 2. According to example embodiments, the memory device 100 may adjust the sign of the offset to thereby reduce a time spent for searching of the optimal read level.

The memory device 100 may set the offset based on the difference between the threshold value and the number of memory cells with the threshold voltage included in the interval 243. Also, the memory device 100 may adjust the offset based on the difference between the threshold value and the number of memory cells with the threshold voltage included in the interval 253.

Figure 3:
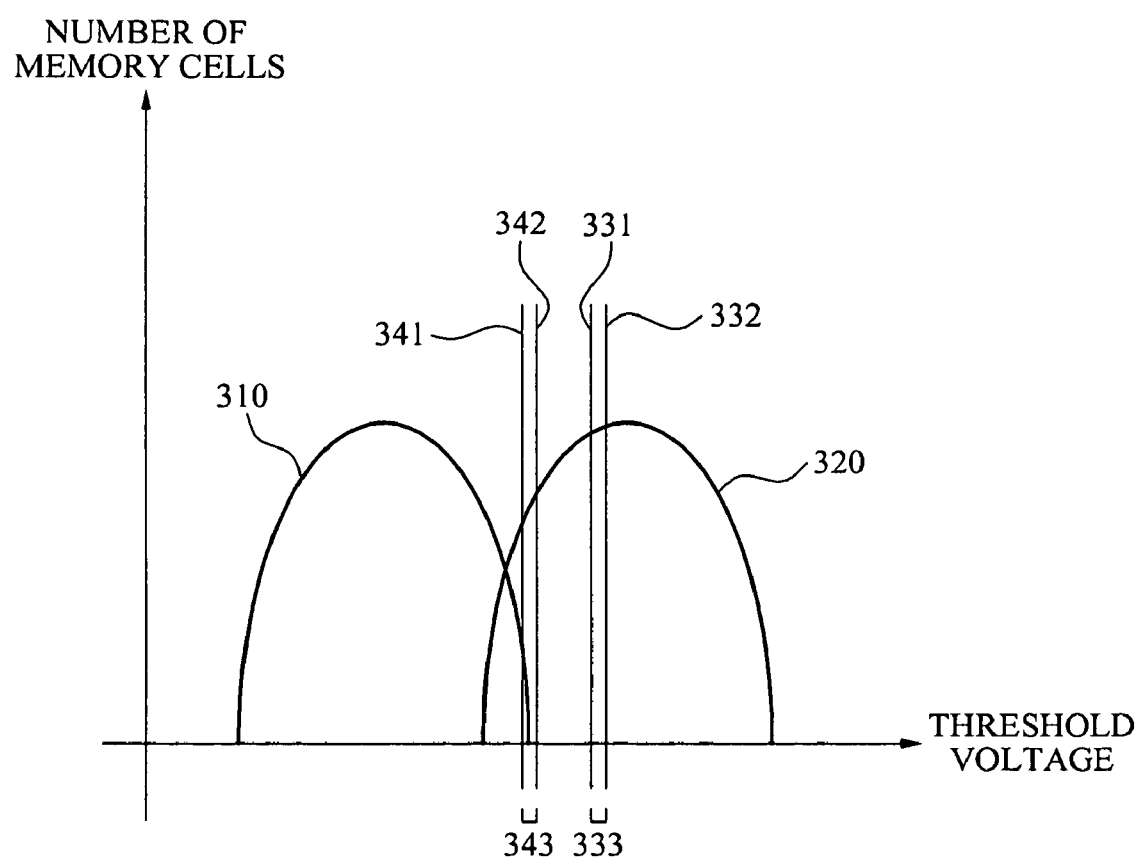
FIG. 3 illustrates another example of an operation of the memory device shown in FIG. 1.

FIG. 3 illustrates another example of an operation of the memory device 100 shown in FIG. 1.

FIG. 3 shows a number of memory cells corresponding to each of a plurality threshold voltages.

A threshold voltage of memory cells storing data A may form a distribution 310. A threshold voltage of memory cells storing data B may form a distribution 320.

The memory device 100 may select an interval 333 as a first reference threshold voltage interval. An upper bound of the interval 333 is a voltage level 332 and a lower bound of the interval 333 is a voltage level 331. The memory device 100 may count a number of memory cells with a threshold voltage included in the interval 333. According to example embodiments, the number of memory cells with the threshold voltage included in the interval 333 may be Z.

The memory device 100 may select an interval 343 as a second reference threshold voltage interval. An upper bound of the interval 343 is a voltage level 342. A lower bound of the interval 343 is a voltage level 341. The memory device 100 may add an offset to the voltage level 331 to select a voltage level 341. Also, the memory device 100 may count a number of memory cells with a threshold voltage included in the interval 343. According to example embodiments, the memory cells with a threshold voltage included in the interval 343 may be W.

If, as the example illustrated in FIG. 3 shows, W is less than Z, the memory device 100 may set a third reference threshold voltage interval, maintaining the current sign (−) of the offset.

The memory device 100 may decide the size and/or sign of the offset based on the number of times that the reference threshold voltage interval is generated.

Figure 4:
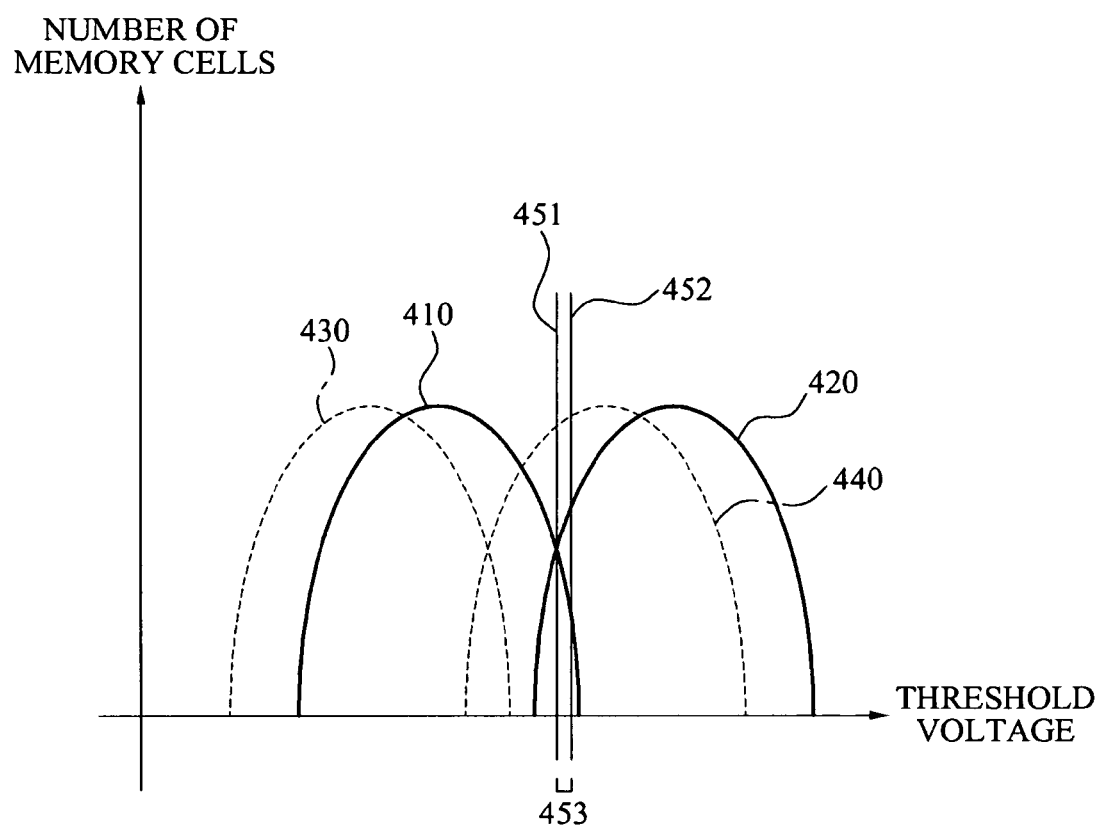
FIG. 4 illustrates still another example of an operation of the memory device shown in FIG. 1.

FIG. 4 illustrates still another example of an operation of the memory device 100 shown in FIG. 1.

FIG. 4 illustrates a number of memory cells corresponding to each of a plurality of threshold voltages.

Threshold voltages of memory cells in which data A is stored immediately after data A is stored may form a distribution 410. Threshold voltages of memory cells in which data B is stored immediately after data B is stored may form a distribution 420.

An optimal read level corresponding to the distributions 410 and 420 may be a voltage level 451. The memory device 100 may store information associated with the voltage level 451 using a fuse cutting scheme, a metadata storage scheme, and the like.

The memory device 100 may set an interval 453 as a first reference threshold voltage interval. A lower bound of the interval 453 may be the voltage level 451 and an upper bound of the interval 453 may be a voltage level 452. The memory device 100 may count a number of memory cells having threshold voltages included in the interval 453 immediately after the data A and B are stored. The memory device 100 may store, as metadata, the number of memory cells included in the interval 453 immediately after the data A and B are stored.

It is assumed that time is elapsed after the data A and B is stored whereby the distribution 410 is moved to a distribution 430 and the distribution 420 is moved to a distribution 440. A cause for a threshold voltage decreasing over time may be charge loss and the like.

After the time is elapsed, the memory device 100 may set the interval 453 as a first reference threshold voltage interval based on information associated with the stored voltage level 45.1. The memory device 100 may count the number of memory cells included in the interval 453. As shown FIG. 4, the number of memory cells that are counted based on the distribution 440 and the interval 453 may be greater than the metadata previously stored immediately after the data A and B were stored in the memory cells. According to example embodiments, the memory device 100 may compare a predetermined or reference threshold value with the number of memory cells that are counted based on the distribution 440 and the interval 453.

The memory device 100 may set a sign of an offset depending on whether the cause of affecting the change in the threshold voltage of memory cell is charge loss, program disturbance, and/or FG coupling. The memory device 100 may decide the size of the offset based on the number of memory cells that are counted based on the distribution 440 and the interval 453.

The charge loss may reduce the threshold voltage whereas the program disturbance and/or FG coupling may increase the threshold voltage. The memory device 100 may further include a monitoring cell to monitor the threshold voltage. The memory device 100 may estimate change in the threshold voltage of the monitoring cell to thereby decide the sign of the offset.

The memory device 100 may set a second reference threshold voltage interval based on the decided offset.

The memory device 100 may adaptively decide a subsequent reference threshold voltage interval based on the number of memory cells included in the reference threshold voltage interval. The memory device 100 may search for the optimal read level using fuzzy theory, a genetic algorithm, a proportional controller, a proportional-integral controller, and/or a PID controller.

Figure 5:
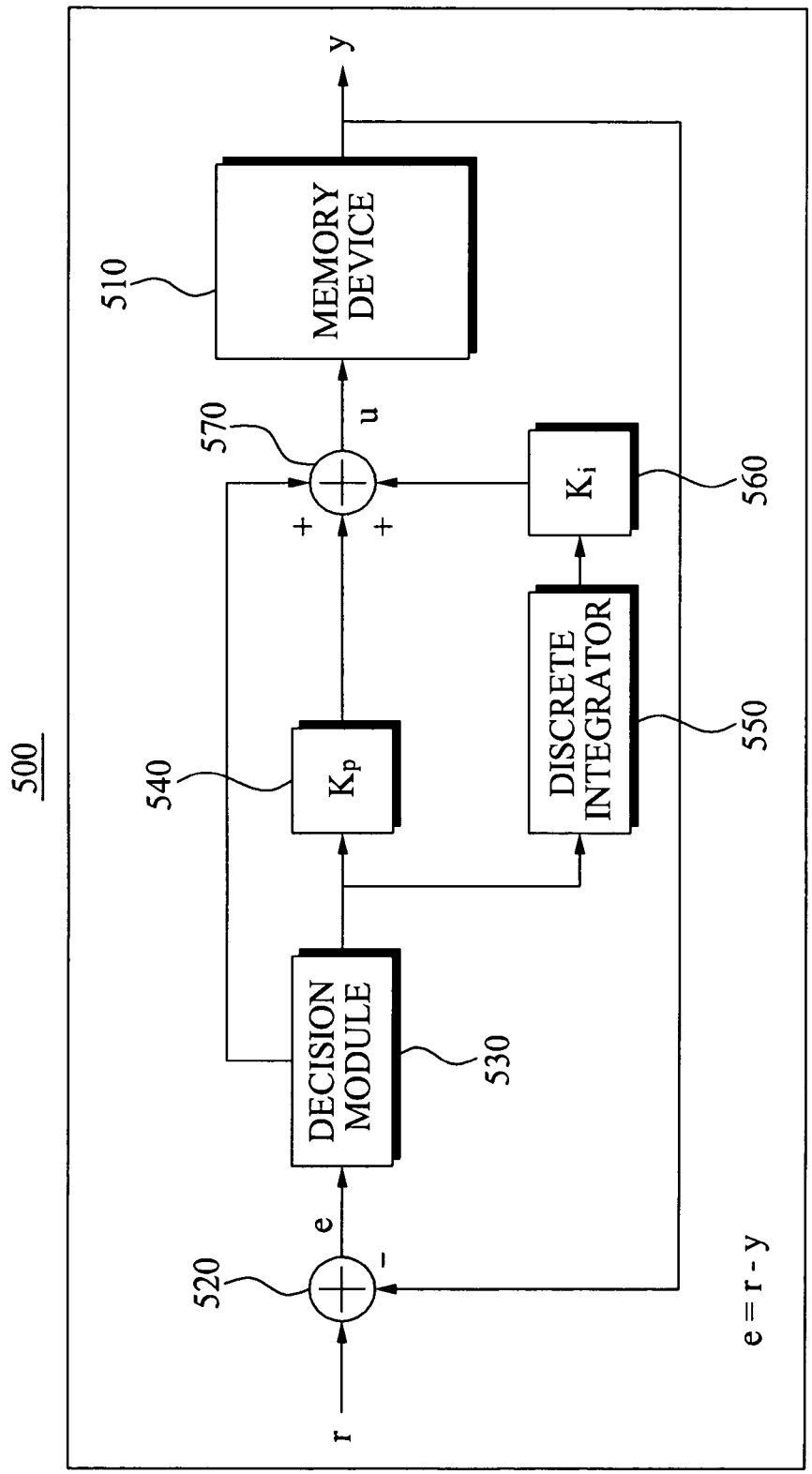
FIG. 5 illustrates an example of an apparatus for controlling a read level according to example embodiments.

FIG. 5 illustrates an example of an apparatus 500 for controlling a read level according to example embodiments.

Referring to FIG. 5, the read level controlling apparatus 500 may include a memory device 510, a decision module 530, a proportional amplifier 540, a discrete integrator 550, and an integral amplifier 560.

According to example embodiments, the decision module 530, the proportional amplifier 540, the discrete integrator 550, and the integral amplifier 560 may be included in a controller positioned outside the memory device 510 and may also be included in a peripheral circuit positioned inside the memory device 510.

Here, r denotes a target value for a number of memory cells, u may be a digital and/or analog value denoting a read level.

The memory device 510 may set a reference threshold voltage interval based on u. The memory device 510 may count y corresponding to a number of memory cells with a threshold voltage included in the reference threshold voltage interval. The memory device 510 may output y. An adder 520 may calculate (r−y), a difference between r and y to thereby obtain error e.

The decision module 530 may decide whether e is included in the acceptable range based on the magnitude of e.

The proportional amplifier 540 may decide gain of proportional Kp based on e. The discrete integrator 550 may perform discrete integration and the integral amplifier 560 may decide gain of integral Ki.

An adder 570 may add an output of the proportional amplifier 540 and an output of the integral amplifier 560 to thereby generate u.

When e is included in the acceptable range, the decision module 530 may control the adder 570 to maintain the current output u.

Figure 6:
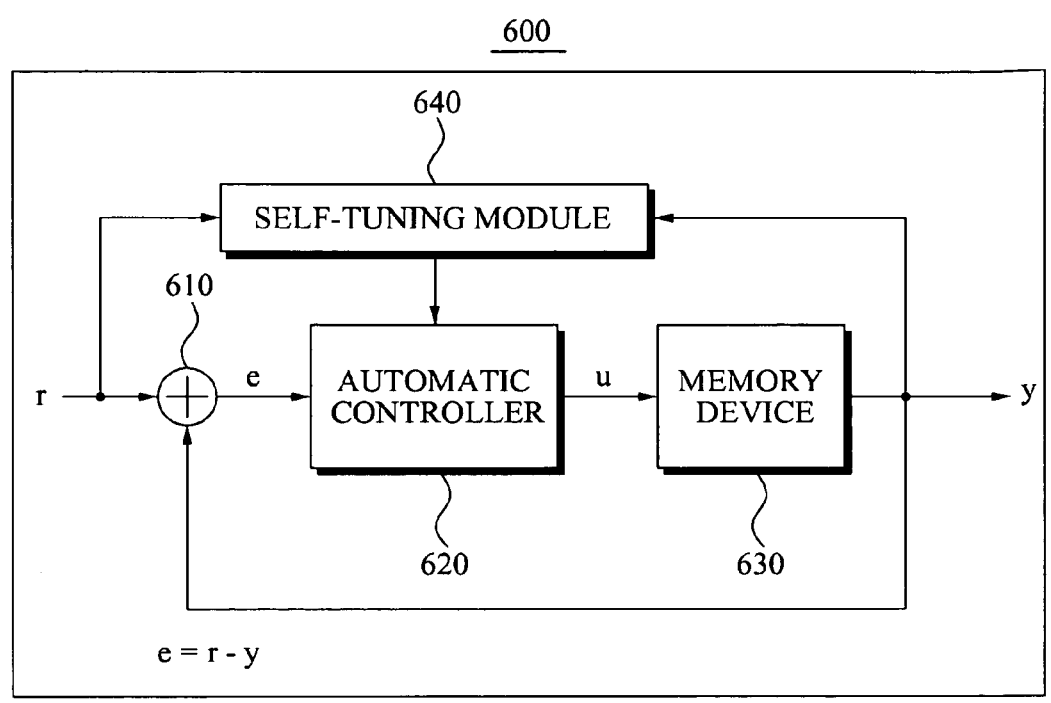
FIG. 6 illustrates another example of an apparatus for controlling a read level according to example embodiments.

FIG. 6 illustrates another example of an apparatus 600 for controlling a read level according to example embodiments.

Referring to FIG. 6, the read level controlling apparatus 600 may include an automatic controller 620, a memory device 630, and a self-tuning module 640.

According to example embodiments, the automatic controller 620 and the self-tuning module 640 may be included in a controller positioned outside the memory device 630 and may also be included in a peripheral circuit positioned inside the memory device 630.

The memory device 630 may set a reference threshold voltage interval based on u. The memory device 630 may output y corresponding to a number of memory cells with a threshold voltage included in the reference threshold voltage interval.

An adder 610 may compare a number of target cells r with the output y of the memory device 630 to thereby generate error e. The error e may satisfy the relationship, e=(r−y).

The automatic controller 620 may generate analog and/or digital output u corresponding to a read level based on e. The automatic controller 620 may decide whether e is included in the acceptable range. When e is included in the acceptable range, the automatic controller 620 may maintain the current output u. Also, when e is included in the acceptable range, the automatic controller 620 may adjust u based on e. The automatic controller 620 may be, for example, a PID controller.

The self-tuning module 640 may set the acceptable range. The self-tuning module 640 may update a factor that affects the acceptable range.

When the automatic controller 620 is a PID controller, the self-tuning module 640 may decide gain of proportional Kp, gain of integral Ki, and the like. The self-tuning module 640 may update Kp and/or Ki based on the output y of the memory device 630.

The self-tuning module 640 may monitor change in a threshold voltage of a monitoring cell included in the memory cell 630. The self-tuning module 640 may decide an initial value of u, Kp, and Ki based on the change in the threshold voltage of the monitoring cell.

Generally, the gain of proportional Kp of the PID controller may reduce a rise time of a response. The gain of proportional Kp may have a value between 1 to 10. The gain of proportional Kp does not eliminate a steady state error of the response.

The gain of integral Ki may eliminate the steady state error of the response. The gain of integral Ki may make a transient response worse. The gain of integral Ki may usually have a value between 0 and 1.

Derivative gain Kd may enhance stability of a system and may also reduce overshooting of the response. Also, the derivative gain Kd may improve a transient response.

Figure 7:
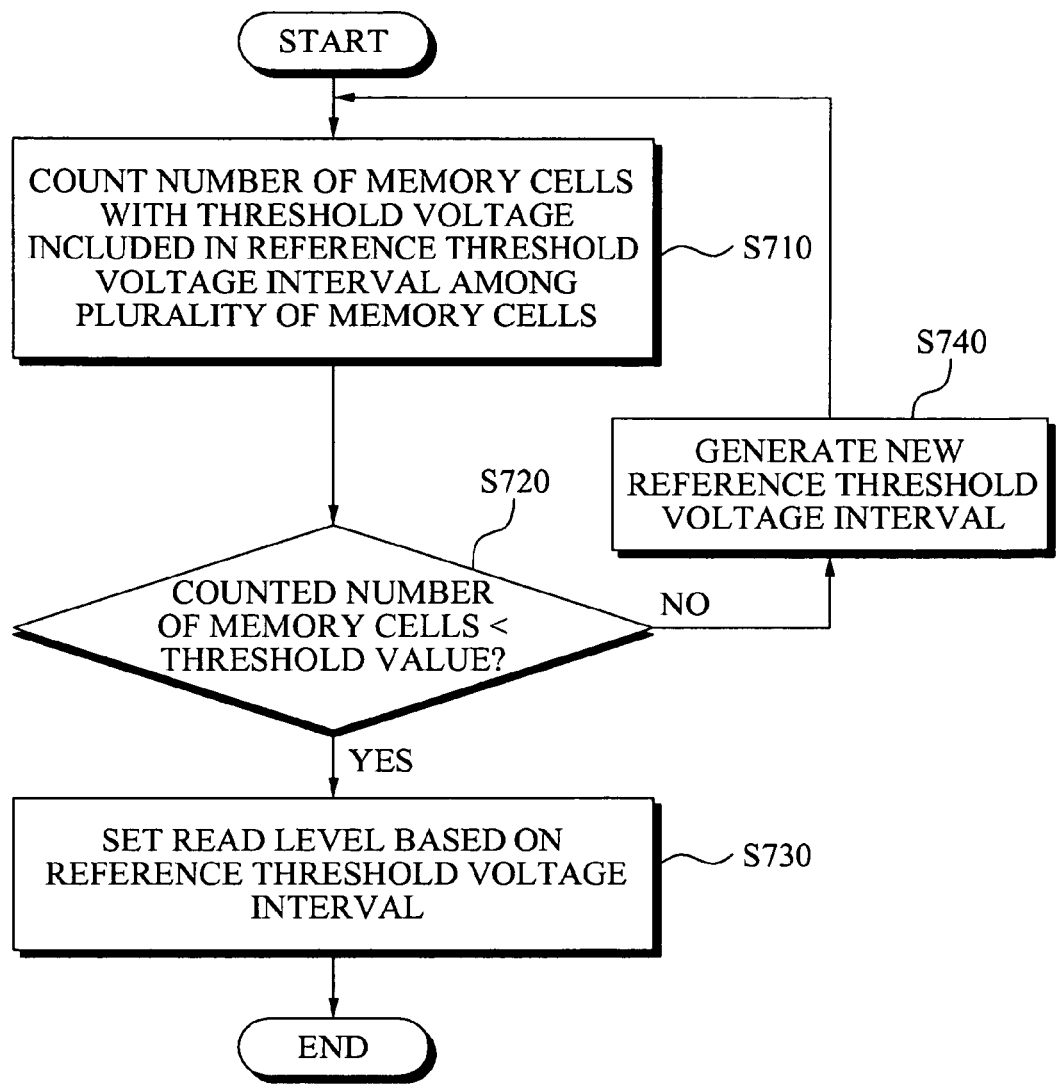
FIG. 7 is a flowchart illustrating an example of a method of controlling a read level according to example embodiments.

FIG. 7 is a flowchart illustrating an example of a method of controlling a read level according to example embodiments.

Referring to FIG. 7, in operation S710, the read level controlling method may count a number of memory cells with a threshold voltage included in a reference threshold voltage interval among a plurality of memory cells.

In operation S720, the read level controlling method may decide whether the counted number of memory cell is less than a predetermined or reference threshold value.

In operation S730, when the counted number of memory cells is less than the threshold value, the read level controlling method may set the read level based on the reference threshold voltage interval.

In operation S740, when the counted number of memory cells is greater than or equal to the threshold value, the read level controlling method may generate a new reference threshold voltage interval.

In operation S710, the read level controlling method may count a number of memory cells with a threshold voltage included in the new reference threshold voltage interval.

Specifically, the read level controlling method may repeat setting of the new reference threshold voltage interval until the number of memory cells with the threshold voltage included in the reference threshold voltage interval becomes less than the threshold value.

According to example embodiments, the read level controlling method may set a read level based on an upper bound, a lower bound, or a representative value of the reference threshold voltage interval in operation S730.

According to example embodiments, in operation S740, the read level controlling method may set an offset based on a difference between the counted number of memory cells and the threshold value. The read level controlling method may add the set offset to an upper bound of the reference threshold voltage interval to thereby generate an upper bound of the new threshold voltage interval. The read level controlling method may add the set offset to a lower bound of the reference threshold voltage interval to thereby generate a lower bound of the new threshold voltage interval. According to example embodiments, the read level controlling method may decide the size of the offset based on the difference between the counted number of memory cells and the threshold value.

According to example embodiments, in operation S740, the read level controlling method may generate the new reference threshold voltage interval according to a PID control scheme that uses, as an input, the comparison result between the counted number of memory cells and the threshold value.

Figure 8:
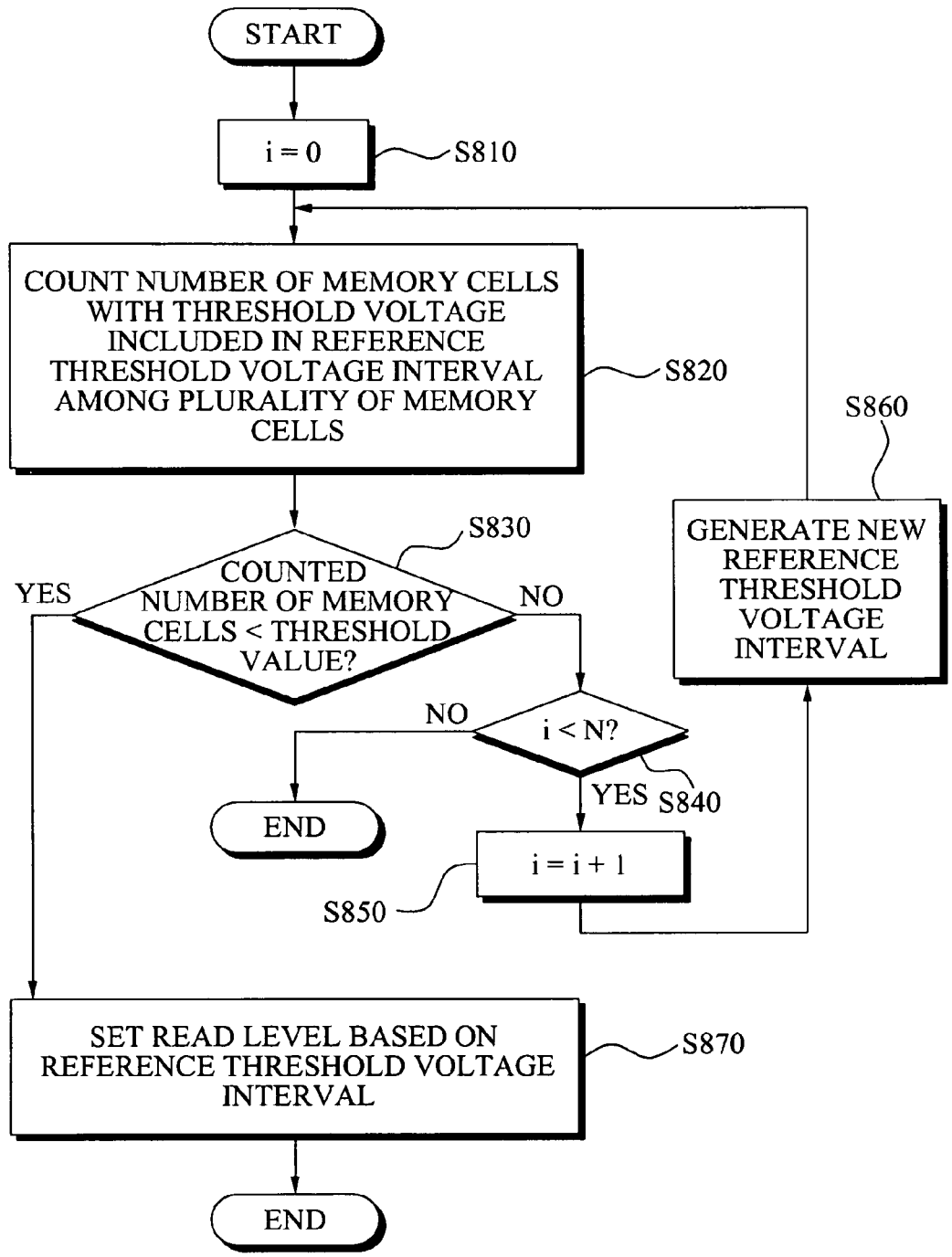
FIG. 8 is a flowchart illustrating another example of a method of controlling a read level according to example embodiments.

FIG. 8 is a flowchart illustrating another example of a method of controlling a read level according to example embodiments.

Referring to FIG. 8, in operation S810, the read level controlling method may initialize index i to zero.

In operation S820, the read level controlling method may count a number of memory cells with a threshold voltage included in a reference threshold voltage interval among a plurality of memory cells.

In operation S830, the read level controlling method may decide whether the counted number of memory cell is less than a predetermined or reference threshold value. In operation S870, when the counted number of memory cells is less than the threshold value, the read level controlling method may set a read level based on the reference threshold voltage interval.

In operation S840, when the counted number of memory cells is greater than or equal to the threshold value, the read level controlling method may decide whether the index i is less than a threshold value N.

In operation S850, when the index i is less than the threshold value N, the read level controlling method may increase the index i by one.

In operation S860, the read level controlling method may generate a new reference threshold voltage interval after increasing the index i by one.

In operation S820, the read level controlling method may count a number of memory cells with a threshold voltage included in the new reference threshold voltage interval.

When the index is greater than or equal to the threshold value N, the read level controlling method may terminate the above sequence.

The read level controlling method according to example embodiments may be recorded in computer-readable media including program instructions to implement various operations embodied by a computer. The media may also include, alone or in combination with the program instructions, data files, data structures, and/or the like. The media and program instructions may be those especially designed and constructed for the purposes of example embodiments, or they may be of the kind well-known and available to those having skill in the computer software arts. Examples of computer-readable media may include magnetic media, for example hard disks, floppy disks, and magnetic tape; optical media, for example CD ROM disks and DVD; magneto-optical media, for example optical disks; and hardware devices that are especially configured to store and perform program instructions, such as read-only memory (ROM), random access memory (RAM), flash memory, and the like. Examples of program instructions may include both machine code, for example produced by a compiler, and files containing higher level code that may be executed by the computer using an interpreter. The described hardware devices may be configured to act as one or more software modules in order to perform the operations of example embodiments.

Example embodiments may be applicable to memory devices that change a threshold voltage of a memory cell to thereby store data, for example, a flash memory, electrically erasable programmable read only memory (EEPROM), a phase shift random access memory (PRAM), a magnetic random access memory (MRAM), and the like. Example embodiment may compare the threshold voltage of the memory cell with a read voltage to thereby read data.

Flash memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In example embodiments, the memory controllers may be constructed to communicate with an external device for example, a host using any one of various types of protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that may maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system, according to example embodiments, may include a microprocessor that may be electrically connected with a bus, a user interface, a modem such as a baseband chipset, a memory controller, and a flash memory device. The flash memory device may store N-bit data via the memory controller. The N-bit data may be processed or will be processed by the microprocessor and N may be 1 or an integer greater than 1. When the computing system is a mobile apparatus, a battery may be additionally provided to supply operation voltage to the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory device comprising:
   a memory cell array including a plurality of memory cells;
   a counter configured to count a number of memory cells having a threshold voltage included in a reference threshold voltage interval among the plurality of memory cells;
   a first decision unit configured to generate a comparison value based on the counted number of memory cells and a threshold value to thereby decide whether to set a read level based on the reference threshold voltage interval; and
   a second decision unit configured to generate a new reference threshold voltage interval based on the comparison value.

2. The memory device of claim 1, wherein the first decision unit is configured so that when the counted number of memory cells is less than the threshold value, the first decision unit sets the read level based on the reference threshold voltage interval.

3. The memory device of claim 2, wherein the first decision unit is configured to generate a digital code corresponding to the read level.

4. The memory device of claim 1, wherein the first decision unit is configured so that if the counted number of memory cells is less than the threshold value, the first decision unit controls the second decision unit to not generate the new reference threshold voltage interval.

5. The memory device of claim 1, wherein the second decision unit is configured to add an offset to an upper bound of the reference threshold voltage interval to thereby generate an upper bound of the new threshold voltage interval, and add the offset to a lower bound of the reference threshold voltage interval to thereby generate a lower bound of the new threshold voltage interval.

6. The memory device of claim 5, wherein the second decision unit is configured to decide the size of the offset based on a difference between the counted number of memory cells and the threshold value.

7. The memory device of claim 5, wherein the second decision unit is configured to decide a sign of the offset based on a variation of the counted number of memory cells.

8. The memory device of claim 5, wherein
   the counter is configured to count a number of memory cells having a threshold voltage included in the new threshold voltage interval.

9. The memory device of claim 5, wherein
   the second decision unit is configured to determine the size of the offset based on a number of times an operation of generating the new threshold voltage interval is executed.

10. The memory device of claim 1, wherein the first decision unit is configured so that if a number of times an operation of generating the new reference threshold voltage interval is executed is greater than or equal to a maximum allowance value, the first decision unit selects a reference threshold voltage interval where the counted number of memory cells is minimum and sets the read level based on the selected reference threshold voltage interval.

11. The memory device of claim 1, wherein the second decision unit is configured to generate the new reference threshold voltage interval according to a proportional integral derivative (PID) control scheme that uses, as an input, the comparison value generated based on the counted number of memory cells and the threshold value.

12. The memory device of claim 3, further comprising:
    a digital-to-analog (D/A) converter configured to generate an analog voltage level corresponding to the generated digital code.

13. The memory device of claim 1, wherein the memory cell array, counter, first decision unit, and second decision unit constitute a feedback loop.

14. The memory device of claim 1, wherein the threshold value may be a number of desired bits of a memory cell corresponding to the reference threshold voltage interval.

15. The memory device of claim 1, wherein the first decision unit is configured so that if a number of times an operation of generating the new reference threshold voltage interval is executed is greater than or equal to a maximum allowance value, the first decision unit controls the second unit to cease generating new reference threshold voltage intervals.

16. A method of controlling a read level, the method comprising:
    counting a number of memory cells having a threshold voltage included in a reference threshold voltage interval among a plurality of memory cells;
    generating a comparison value based on the counted number of memory cells and a threshold value;
    deciding whether to set a read level based on the reference threshold voltage interval, according to the comparison value; and
    deciding whether to set a new reference threshold voltage interval based on the comparison value.

17. The method of claim 16, wherein deciding whether to set the read level includes setting the read level based on the reference threshold voltage interval if the counted number of memory cells is less than the threshold value.

18. The method of claim 16, wherein deciding whether to generate the new reference threshold voltage interval includes generating the new reference threshold voltage interval if the counted number of memory cells is greater than or equal to the threshold value.

19. The method of claim 16, further comprising:
setting an offset based on a difference between the counted number of memory cells and the threshold value;
adding the set offset to an upper bound of the reference threshold voltage interval to thereby generate an upper bound of the new threshold voltage interval; and
adding the set offset to a lower bound of the reference threshold voltage interval to thereby generate a lower bound of the new threshold voltage interval.

20. The method of claim 19, wherein setting the offset includes deciding the size of the offset based on a difference between the counted number of memory cells and the threshold value.

21. The method of claim 16, wherein the new reference threshold voltage interval is generated according to a PID control scheme that uses, as an input, the comparison value generated based on the counted number of memory cells and the threshold value.

22. A computer-readable recording medium storing a program for implementing a method of controlling a read level, the method comprising:
counting a number of memory cells having a threshold voltage included in a reference threshold voltage interval among a plurality of memory cells;
generating a comparison value based on the counted number of memory cells and a threshold value;
deciding whether to set a read level based on the reference threshold voltage interval, according to the comparison value; and
deciding whether to set a new reference threshold voltage interval based on the comparison value.

* * * * *